(12) United States Patent
Cheng et al.

(10) Patent No.: US 8,277,668 B2
(45) Date of Patent: Oct. 2, 2012

(54) METHODS OF PREPARING PRINTED CIRCUIT BOARDS AND PACKAGING SUBSTRATES OF INTEGRATED CIRCUIT

(75) Inventors: FanXiong Cheng, Shanghai (CN); Peifeng Chen, Shanghai (CN); Haitao Fu, Shanghai (CN); Yonghong Luo, Shanghai (CN)

(73) Assignee: Shanghai Meadville Science & Technology Co., Ltd. (CN)

( * ) Notice: Subject to any disclaimer, the term of this patent is extended or adjusted under 35 U.S.C. 154(b) by 1054 days.

(21) Appl. No.: 12/079,337

(22) Filed: Mar. 25, 2008

(65) Prior Publication Data

US 2008/0251495 A1 Oct. 16, 2008

(30) Foreign Application Priority Data

Apr. 10, 2007 (CN) .......................... 2007 1 0039305

(51) Int. Cl.
*H01B 13/00* (2006.01)
*B05D 5/12* (2006.01)
*C23C 14/34* (2006.01)

(52) U.S. Cl. ................. 216/18; 216/38; 216/39; 216/52; 204/192.1; 427/99.5

(58) Field of Classification Search .................. None
See application file for complete search history.

(56) References Cited

U.S. PATENT DOCUMENTS

| 5,600,103 | A | 2/1997 | Odaira et al. |
| 6,528,874 | B1 | 3/2003 | Iijima et al. |
| 6,555,209 | B1 | 4/2003 | Yoshimura et al. |
| 7,772,116 | B2 * | 8/2010 | Akram et al. ................. 438/667 |
| 7,906,850 | B2 * | 3/2011 | Wang et al. ................... 257/774 |
| 7,989,345 | B2 * | 8/2011 | Akram et al. ................. 438/667 |
| 2006/0183316 | A1 * | 8/2006 | Larnerd et al. ................ 438/622 |
| 2007/0045780 | A1 * | 3/2007 | Akram et al. ................. 257/621 |
| 2007/0138630 | A1 * | 6/2007 | Wang et al. ................... 257/723 |
| 2007/0257373 | A1 * | 11/2007 | Akram et al. ................. 257/774 |
| 2007/0262441 | A1 * | 11/2007 | Chen ............................. 257/706 |
| 2008/0230260 | A1 * | 9/2008 | Shih .............................. 174/257 |
| 2008/0251495 | A1 * | 10/2008 | Cheng et al. .................... 216/13 |

FOREIGN PATENT DOCUMENTS

| CN | 1567551 A | 1/2005 |
| JP | 6-314878 A | 11/1994 |

OTHER PUBLICATIONS

Office Action from Chinese Application No. 2007100393053 dated Jun. 12, 2009.
Office Action from Chinese Application No. 2007100393053 dated Mar. 2, 2010.

* cited by examiner

*Primary Examiner* — Allan Olsen
(74) *Attorney, Agent, or Firm* — Lerner, David, Littenberg, Krumholz & Mentlik, LLP

(57) ABSTRACT

A method of forming printed circuit boards and packaging substrates. After blind vias are created in a dielectric layer, a first seed layer is provided in the vias and on the dielectric layer. Copper is applied to fill the vias and to form a copper layer over the vias and over the first seed layer. The first seed layer and the copper layer are removed and a second seed layer is formed on the dielectric layer and the exposed surfaces of the vias. A wire pattern is then formed using a photo-sensitive thin film applied to the second seed layer, and the wires in the wire pattern are thickened. The photo-sensitive thin film and the exposed portions of the second seed layer are removed to form a first conductive pattern of wires. The process may be repeated to form a second conductive pattern of wires on the first pattern.

9 Claims, 7 Drawing Sheets

METHODS OF PREPARING PRINTED CIRCUIT BOARDS AND PACKAGING SUBSTRATES OF INTEGRATED CIRCUIT

TECHNICAL FIELD

The present application relates to a semi-additive method for preparing printed circuit boards and a packaging substrate of a semiconductor integrated circuit, in particular to a method of effecting inter-layer interconnection based both on via-filling plating technique and preparing fine wires through a semi-additive process.

BACKGROUND OF THE INVENTION

With developments of society and scientific technology, the electronic products become smaller and smaller, resulting that printed circuit boards for connections between different devices and substrates for IC packaging are required to become lighter, thinner, shorter and smaller, while maintaining good electrical properties and thermal properties. In order to meet the above requirements, both conductive wires having smaller size and highly reliable conductive vias having smaller size are two technical requirements that must be satisfied.

There are three typical methods for forming wires: (1) the subtractive method, i.e., forming an etch resistant pattern on the surface of copper foil by film development; removing the exposed copper foil by selectively etching; and then forming a conductive pattern by removing the etch resistant pattern. Referring to FIG. 1 (11—a dielectric layer, 12—a copper layer, 13—a thin film), this process comprises the following steps: step 1, forming a laminated plate of the cover copper layer 12 on the laminated dielectric layer 11 (FIG. 1a); step 2, applying a thin film 13 to form an etch resistant layer through image-transfer and development (FIG. 1b); step 3, selectively etching to remove exposed copper layer (FIG. 1c); step 4, removing the thin film to obtain the conductive pattern (FIG. 1d). This method has a primary disadvantage that the exposed copper is etched sideward when it is etched downwards during etching. Therefore, the copper layer will be over-etched when the thickness of the copper layer is normal. As a result, it is difficult to form wires, thus limiting application of the subtractive method in forming fine lines.

(2) The fully-additive method, i.e., a method of forming a conductive pattern by selectively electroless-depositing copper after exposing a dielectric substrate comprising a photo-sensitive catalyst according to a wire pattern. Referring to FIG. 2 (21—a photo-sensitive resin, 22—an exposed area, 23—an electroless thick copper). This method comprises the following steps: step 1, selecting a photo-sensitive resin containing a photo-sensitive catalyst (FIG. 2a); step 2, forming a plating pattern by exposing (FIG. 2b); step 3, selectively electroless plating thick copper to form wires (FIG. 2c). This method is suitable for forming a fine line. It, however, requires a specific substrate. Therefore, it has a disadvantage of high cost, and it has not been perfected yet.

(3) The semi-additive method, comprising chemically depositing copper onto a dielectric substrate to form a thin copper foil; pattern plating to thicken a conductor; and then removing the excessive thin copper foil by rapid etching to form a conductive pattern. Referring to FIG. 3 (31—a substrate, 32—an electroless deposited copper layer, 33—a thin film, 34—a plated copper layer), this method comprises the following steps: step 1, electroless plating copper onto a substrate 31 to form a seed layer 32 (FIG. 3a); step 2, providing a thin film 33 and forming a plating resistant layer by image-transfer (FIG. 3b); step 3, pattern plating to thicken wires (FIG. 3c); step 4, removing the film (FIG. 3d); and step 5, rapidly etching to form a conductive pattern (FIG. 3e). Because the copper layer obtained by electroless depositing is very thin, so that it is easy for etching, this method is suitable to form a fine wire.

Additionally, there are other methods for forming lines, for example, a modified semi-additive method relatively widely used, which comprises the following steps: step 1, chemically depositing copper; step 2, panel plating; step 3, forming a plating resistant layer by pattern-transfer; step 4, plating copper and an etch resistant layer according to a pattern; step 5, etching copper to get the conductive pattern after removing the plating resistant layer; step 6, removing the etch resistant layer to obtain the final conductive pattern. This method can obtain finer lines than those obtained by a subtractive method, by controlling the thickness of the copper layer obtained by panel plating. However, when compared with the semi-additive method described above, the ability of the modified semi-additive method to form fine lines is still limited, because the copper layer obtained by plating has a thickness greater than that of the copper layer obtained by electroless plating. Generally, the subtractive method is a traditional process which is applied most widely. But it is limited by its limited ability to form fine lines. Although the fully-additive method is suitable to form fine lines, it requires a specific substrate. Therefore, it has a disadvantage of high cost, and it is still not perfect yet. The semi-additive method is a combination of the fully-additive method and the subtractive method, which is an optimized method for forming fine wires recently.

After forming wires, it is necessary to form interconnections between different layers so that an electrical connection can be formed in multi-layer printed circuit boards. Conductive blind vias or through holes are primarily used to connect different layers. There are many methods for forming conductive blind vias or through holes. Five of them are listed below:

(1) Mechanical perforation, which is the conventional method for forming conductive through holes. For example, the desired through holes are formed in a substrate through a punch or a drill press, and then hollow conductive through holes are formed by depositing or plating copper. Referring to FIG. 4, reference number 41 refers to a substrate, reference number 42 refers to a lower layer of wires, reference number 43 refers to a dielectric layer, reference number 44 refers to a hollow conductive through hole, and reference number 45 refers to an upper layer of wires. The aperture has a greater diameter when formed by the mechanical perforation. Therefore, it is difficult to increase the density of wires.

(2) Optical imaging dielectric or laser perforation technique for forming blind conductive vias. The method for forming blind conductive vias comprises the following steps: forming micro-dents on photo-sensitive dielectric materials by an image-transfer technique, or forming micro-dents directly on dielectric materials by a laser perforation technique; and then forming blind conductive vias by depositing or plating copper, as described in FIG. 5 (wherein, 51—a substrate, 52—a lower layer of wires, 53—a dielectrics layer , 54—an upper layer of wires, and 55—a blind conductive via). The method forms hollow conductive vias. However, the conductivity, thermal conductivity and reliability of the hollow conductive vias are lower than those of solid blind vias. At the same time, this structure cannot provide a stacked via structure, therefore, it is difficult to increase the density of wires.

(3) Japanese patent No. 6-314878 discloses a method of wholely conducting a lower wire layer and forming a resist pattern having an opening portion and depositing metal on a concave section of the resist pattern by means of electrolytic plating to form a pillar conductor. However, the method has a problem that the height of the pillar conductor is easily non-uniform. At the same time, the plating current density cannot be increased, so the formation of the pillar takes a long time.

(4) U.S. Pat. No. 6,555,209B1 discloses a method of forming solid conductor, comprising: coating an etching-resistance metal on the lower wiring layer; forming a plating layer above the said protective metal by electrolytic plating; forming a mask layer on the surface of the plating layer where pillar-like metallic body is formed; etching the said plating layer to form the pillar; etching the protective metallic layer to get the lower layer pattern. However, the method has the next disadvantage. The diameter of the connection pillar with a certain height is smaller than the bottom portion because of the etching factor, which makes it difficult to narrow the gap between the connection pillar needed to form a fine circuit pattern. And so the method is still limited to increase the wire density.

(5) Copper filling plating for forming conductive vias, comprising: forming micro-dents on photo-sensitive dielectric materials by an image-transfer technique, or forming micro-dents, directly on dielectric materials by a laser perforation technique; and then forming blind conductive vias by depositing or plating copper. During the process of plating, not only the copper layer is thickened, but also the via is filled by filling-vias techniques. This method can provide stacked via structure easily and can produce the conductive vias with high reliability. However, in the practical process of plating, the copper layer generally has a greater thickness in order to fill the vias and the wires are formed by subtractive method, which is a disadvantage for the preparation of fine lines.

To summarize the above description, firstly, the semi-additive method is a preferred method to form fine lines; secondly, a pillar-like conductor via is a preferred method to form the electrical connections between different layers, where the stacked via structure can be applied and then the wire density can be increased. However, the conventional semi-additive method cannot provide solid conductive vias, thereby cannot provide stacked vias to connect any layers. On the other hand, there are different kinds of methods as described above which can form solid conductive vias. But the methods still have many disadvantages as described above or are not compatible with the semi-additive process. There is a necessity to provide a method having advantages both of the semi-additive method and solid conductor vias, i.e., easily providing interconnections between any layers by solid conductive vias and a structure of stacked vias, while fine lines can be easily fabricated by a semi-additive method. The present invention provides a technical solution which meets above requirements.

SUMMARY OF THE INVENTION

With respect to the above problems in the arts, the object of the present invention is to provide a method of forming solid conductive vias, providing interconnections between any layers by a structure of stacked vias, and forming wires by a semi-additive method, thereby increasing density of wires, reducing pitches between wires and providing fine wires.

In order to achieve the above object, the present invention provides a method of forming wires and interconnection between layers based on filling-vias plating and a semi-additive process, comprising the following steps:

(1) providing a dielectric layer on a substrate;
(2) providing blind vias on said dielectric layer;
(3) providing a first seed layer after providing the blind vias;
(4) providing solid conductive vias by a filling-vias plating process after providing the first seed layer, and also providing a copper layer covering the first seed layer during the filling-vias plating process;
(5) removing said first seed layer as well as the copper layer formed thereon, and retaining solid copper pillars in the conductive vias;
(6) providing a second seed layer which is to be used to form wires by a semi-additive process;
(7) providing a photo-sensitive thin film, and providing such a thin film which is used as a plating resistant layer by image-transfer to expose a wire pattern;
(8) thickening the wires;
(9) removing the photo-sensitive thin film;
(10) removing the exposed second seed layer and retaining the thickened wires, thus forming a desired conductive pattern;
(11) repeating steps (1)-(10) to form an upper layer of wires, thereby providing the inter-layer interconnections by the solid conductive pillars and providing fine wires.

As compared to the prior art, the present invention has the following advantages:

The present invention relates to a method based on filling-vias plating and a semi-additive method, which are different from the corresponding techniques described in the background art. The present invention relates to filling-vias panel plating. Therefore, it will not be affected by distribution of the pattern, and can greatly reduce the difficulties of forming solid conductive copper pillars. Furthermore, the present invention can provide stacked vias between different layers, and can effectively increase the density of wires. At the same time, the interconnection between the layers is effected by solid copper pillars, thereby producing conductive vias having high reliability. In addition, the semi-additive method is used in the present invention to form wires. As a result, fine wires can be produced without the limits of the subtractive method and the high cost of the fully-additive method.

BRIEF DESCRIPTION OF THE DRAWINGS

FIGS. 1a, 1b, 1c and 1d describe a flow diagram of a subtractive method, in which FIG. 1a is a cross-section view of dielectric layer 11 and copper layer 12 (copper foil); FIG. 1b is a cross-section view of the dielectric layer 11 and the copper layer 12 after forming a plating resistant layer 13 (thin film); FIG. 1c is a cross-section view of a dielectric layer 11 and a copper layer 12 after etching; FIG. 1d is a cross-section view of a dielectric layer 11 and a copper layer 12 after removing the film.

FIGS. 2a, 2b and 2c describe a flow diagram of a fully-additive process, in which FIG. 2a is a cross-sectional view of a photo-sensitive resin layer 21 (a plating resistant substrate); FIG. 2b is a cross-section view of the substrate after forming a plating non-resistant area 22 by exposing; FIG. 2c is a cross-section view of a copper layer 23 provided by electroless plating thick copper and the substrate.

FIGS. 3a, 3b, 3c, 3d and 3e describe a flow diagram of a semi-additive process, in which FIG. 3a is a cross-section view of an electroless copper layer 32 and substrate 31; FIG. 3b is a cross-sectional view of the layer of electroless copper and the substrate after forming a plating resistant layer 33 (thin film); FIG. 3c is a cross-section view of the electroless copper layer and the substrate after thickening by plating according to a pattern; FIG. 3d is a cross-section view of the electroless copper layer and the substrate after removing the thin film; and FIG. 3e is a cross-section view of the electroless copper layer and the substrate after flash etching (rapidly etching).

DETAILED DESCRIPTION

Figure 1A:
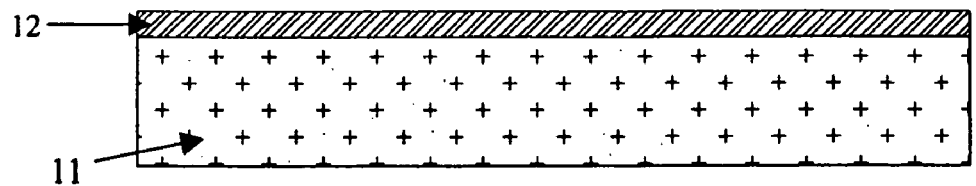
Figure 1B:
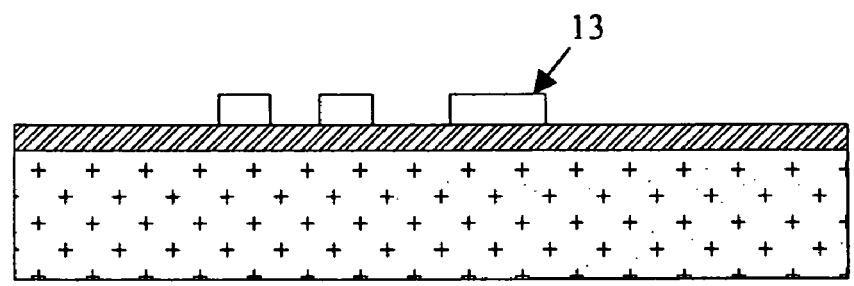
Figure 1C:
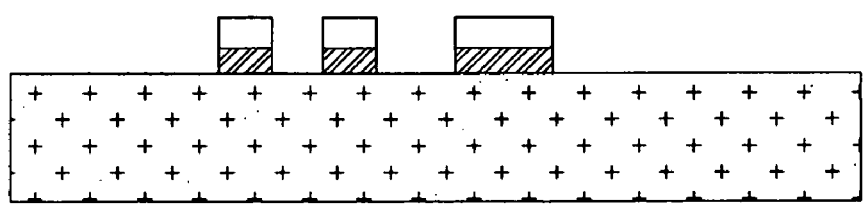
Figure 1D:
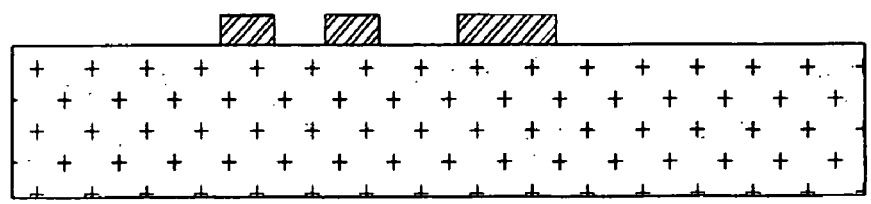
Figure 2A:
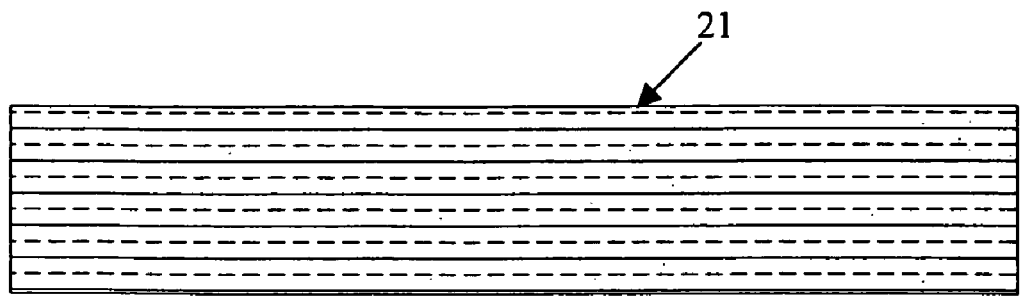
Figure 2B:
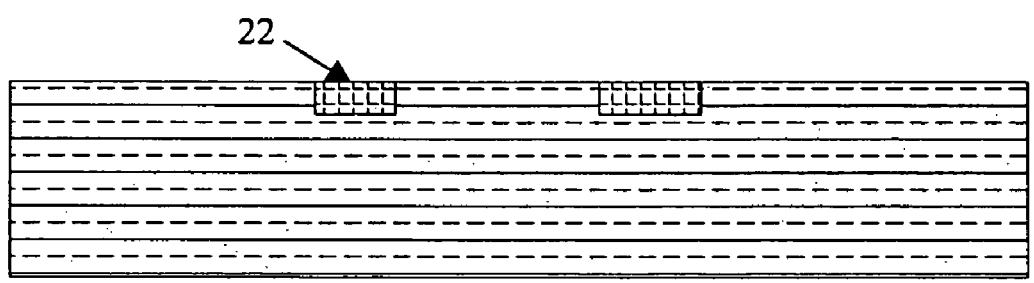
Figure 2C:
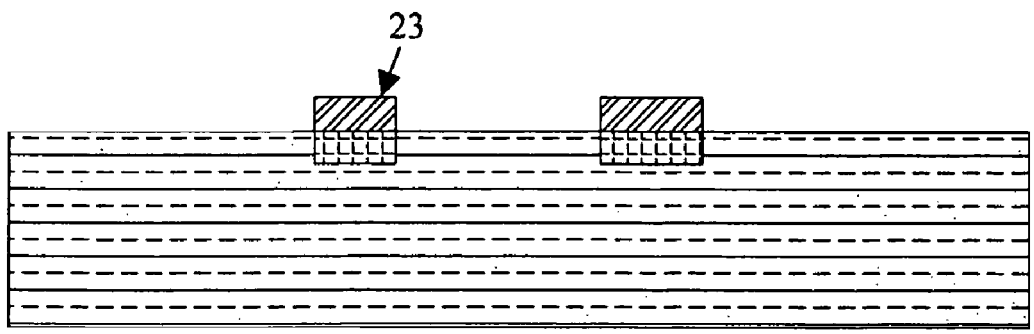
Figure 3A:
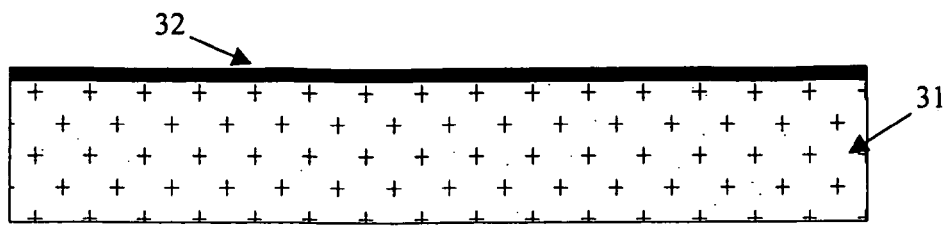
Figure 3B:
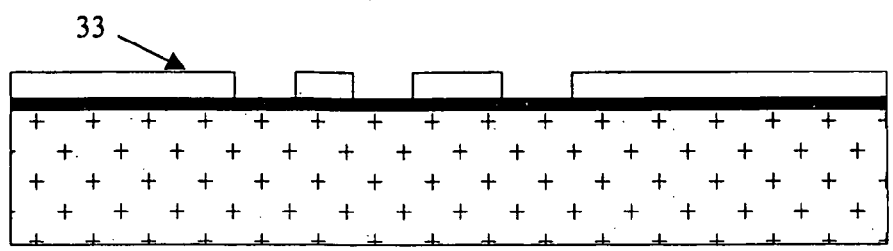
Figure 3C:
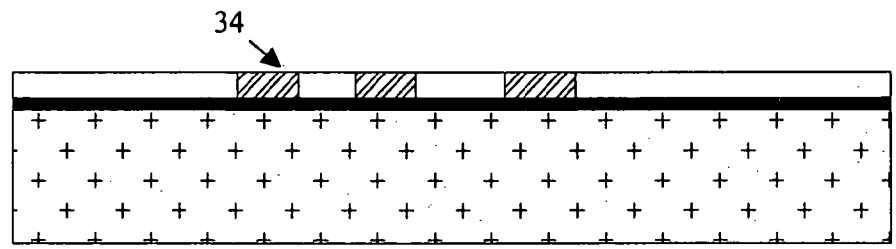
Figure 3D:
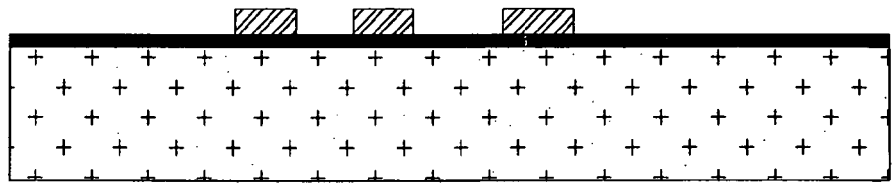
Figure 3E:
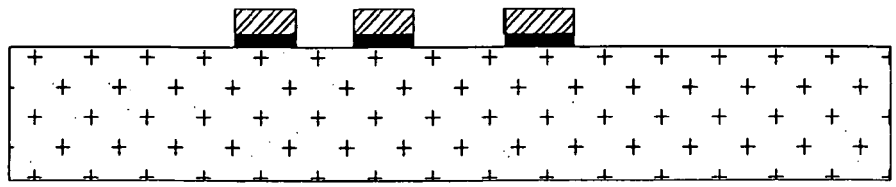
Figure 4:
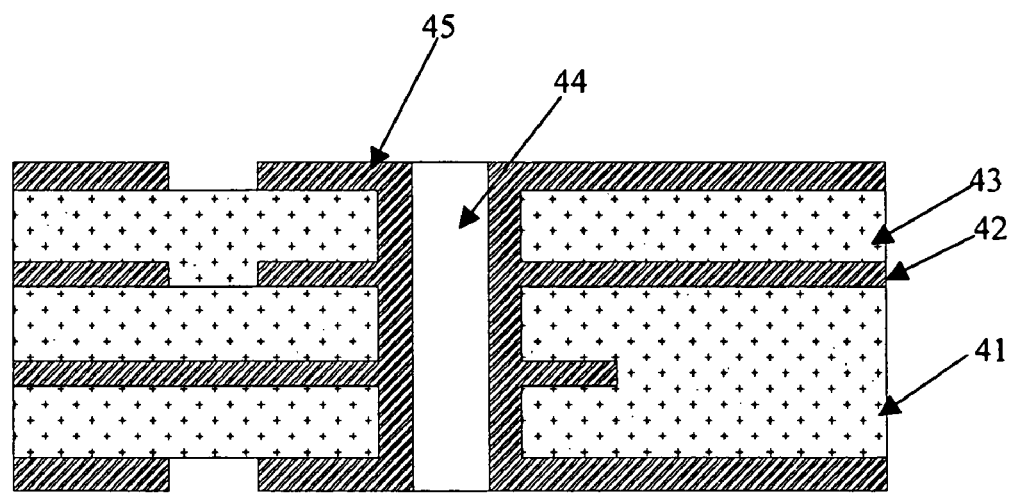
FIG. 4 is a cross-section view of conductive vias structure formed by mechanical perforation.
Figure 5:
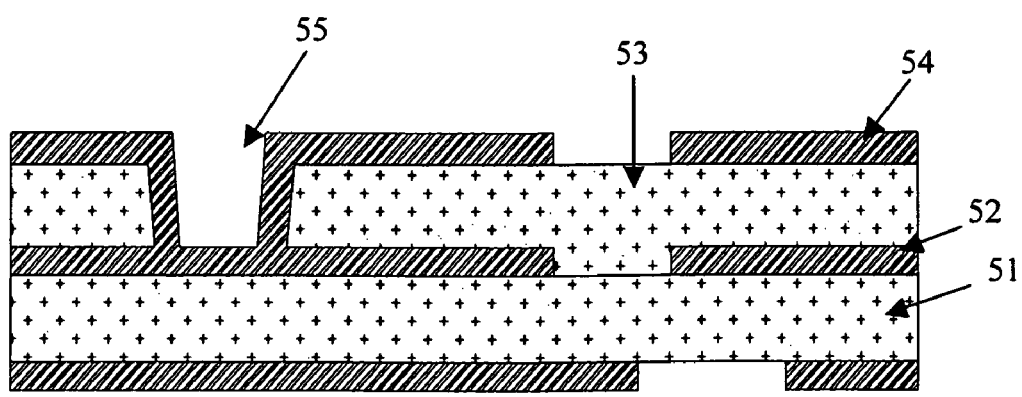
FIG. 5 is a cross-section view of the structure of the conventional blind conductive vias.

The present invention is described in detail by reference to the accompanying drawings.

Figure 6A:
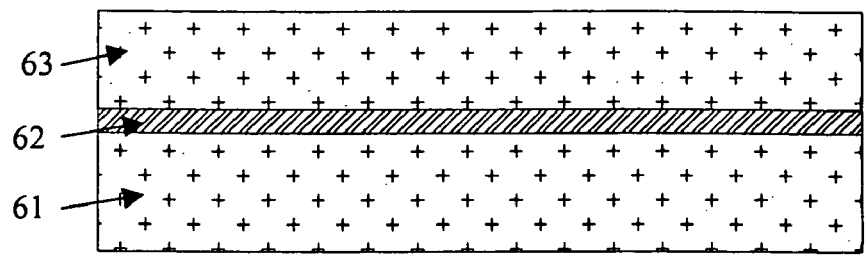
FIGS. 6a, 6b, 6c, 6d, 6e, 6f, 6g, 6h, 6i and 6j describe a flow diagram of one embodiment according to the present invention.

According to FIGS. 6a, 6b, 6c, 6d, 6e, 6f, 6g, 6h, 6i and 6j, in which reference number 61 refers to the lower layer of dielectric, reference number 62 refers to a copper foil, reference number 63 refers to a dielectric layer, reference number 64 refers to a first seed layer, reference number 65 refers to a copper layer, reference number 66 refers to a second seed layer, and reference number 67 refers to a plating resistant layer, the method according to the present invention comprises the following steps:

(1) Firstly providing a dielectric layer on a substrate according to FIG. 6a. In this embodiment, the substrate is a composite of a bottom dielectric layer 61 and a copper foil layer 62. The dielectric layer can be formed on the substrate by coating resin, filming or laminating. If laminated, then the laminated dielectric layer can be coated with or without copper foil. The substrate can be a composite coated with a copper foil and other materials without copper foil. In this embodiment, the dielectric layer 63 is formed on the copper foil 62 by laminating, as described in FIG. 6a.

Figure 6B:
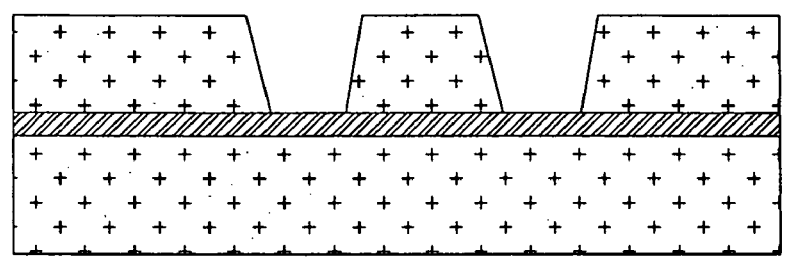

(2) Providing blind vias on said dielectric layer according to FIG. 6b. The blind vias can be formed by laser perforation, plasma etching or photo exposure. With respect to the dielectric layer without copper foil, the blind conductive vias are formed directly by laser perforation. With respect to the dielectric layer with copper foil, the blind vias can be formed by direct laser perforation, or firstly providing openings through etching copper foil and then laser perforating. With respect to the dielectric layer with copper foil, the blind vias can further be formed by firstly removing the copper, and then laser perforating. In this embodiment, the blind conductive vias are formed by laser perforation.

Figure 6C:
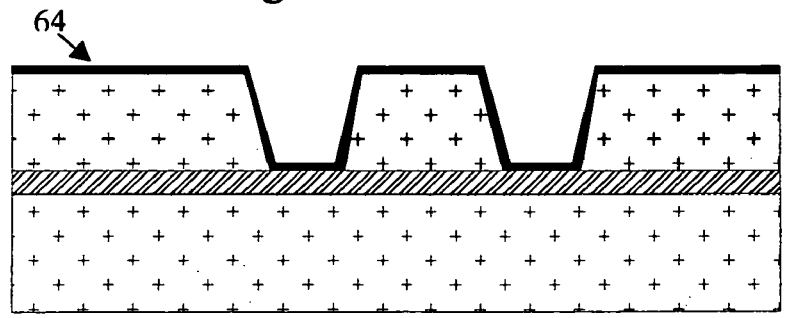

(3) Providing a first seed layer after providing blind vias according to FIG. 6c. The first seed layer which is a conductive layer can be formed by chemical deposition, sputtering and other methods. In this embodiment, a first seed layer 64 is formed by electroless plating copper, as described in FIG. 6c.

Figure 6D:
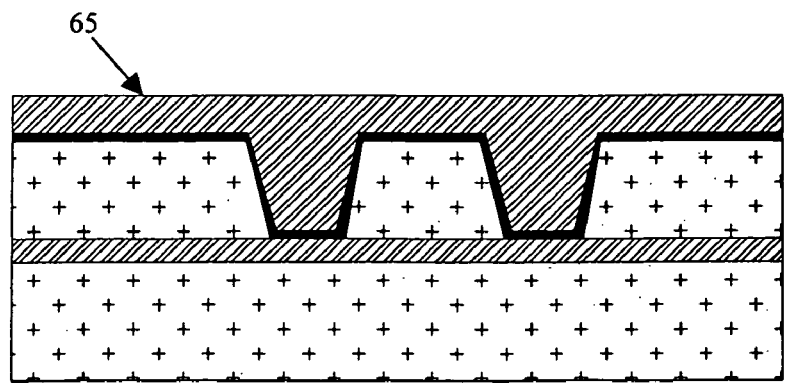

(4) Providing solid conductive vias by a filling-via plating process after providing the first seed layer, according to FIG. 6d. In this embodiment, the solid conductive vias are formed by filling-via plating. During plating, a copper layer is also formed onto the first seed layer. In this embodiment, the copper layer generally has a thickness in the range between 12 and 40 microns, as described in 6d.

Figure 6E:
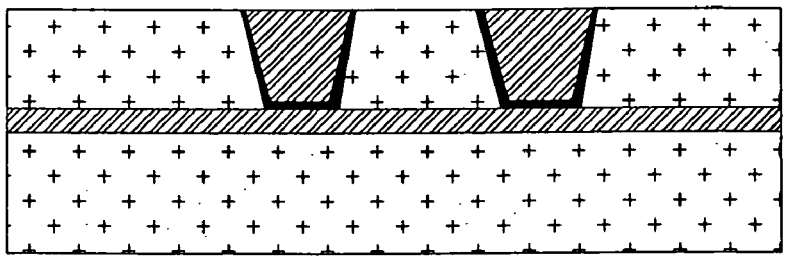
Figure 6F:
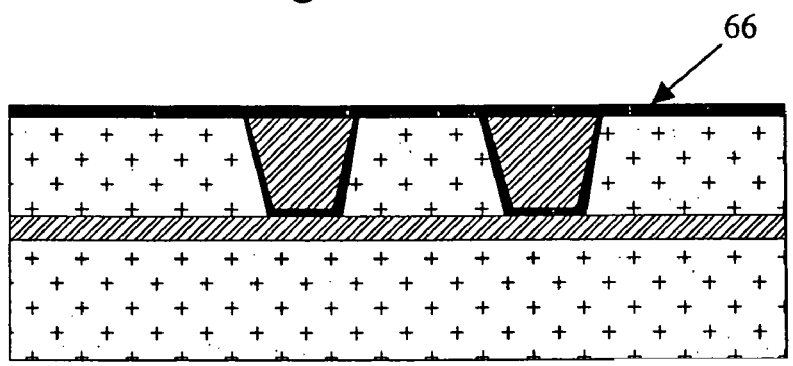

(5) Removing the said first seed layer as well as the copper layer formed thereon, and retaining solid copper pillars in the conductive vias, according to FIG. 6e. The copper layer on the first dielectric layer can be removed by etching, abrading or other methods. In this embodiment, the plated copper layer on the dielectric layer can be removed by etching, while retaining the solid copper pillars in the conductive vias, according to FIG. 6e.

(6) Providing a second seed layer which is used to form wires by a semi-additive process. In step (6), the second seed layer is a conductive layer, can be formed by chemical deposition, sputtering or other methods. In this embodiment, the second seed layer 66 which is a conductive layer is formed by chemical copper deposition, according to FIG. 6f.

Figure 6G:
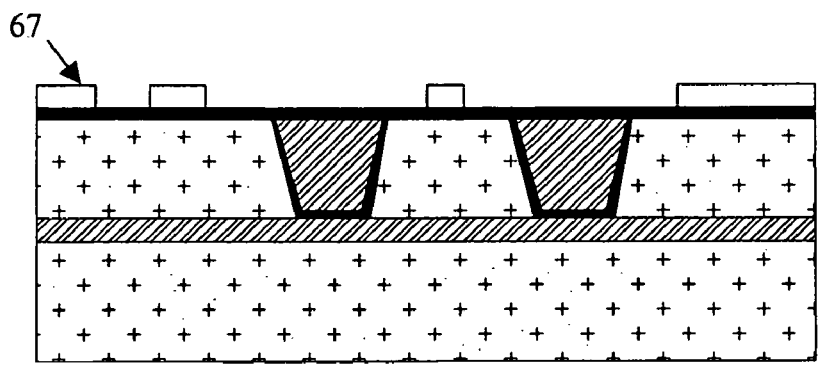
Figure 6H:
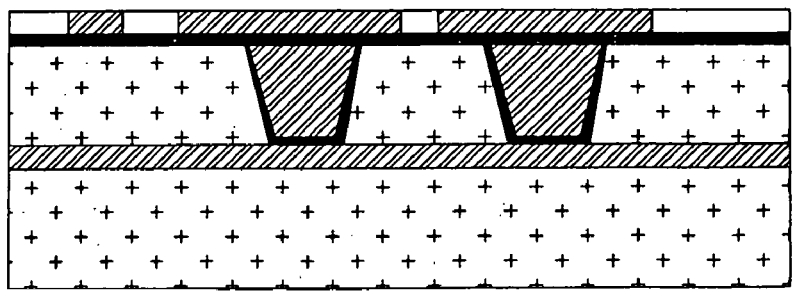

(7) Providing a photo-sensitive thin film and providing a plating resistant layer 67 by image-transfer to expose a wire pattern, according to FIG. 6g.

(8) Thickening wires. In this embodiment, the wires in the pattern are thickened by plating, according to FIG. 6h.

Figure 6I:
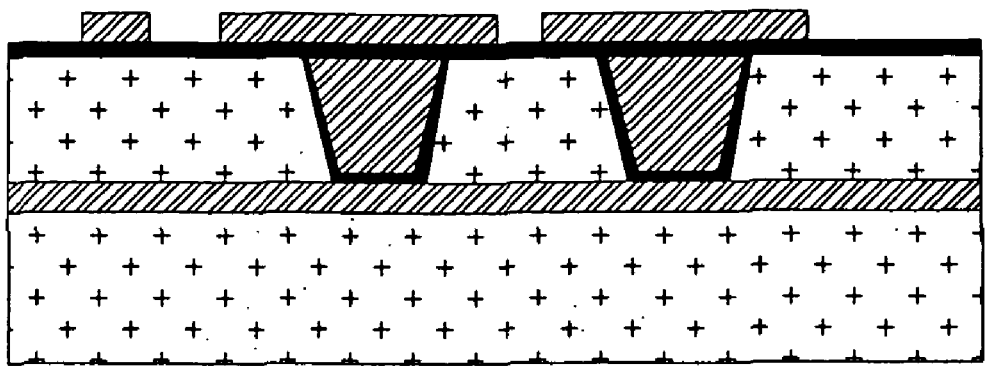

(9) Removing the photo-sensitive thin film, according to FIG. 6i.

Figure 6J:
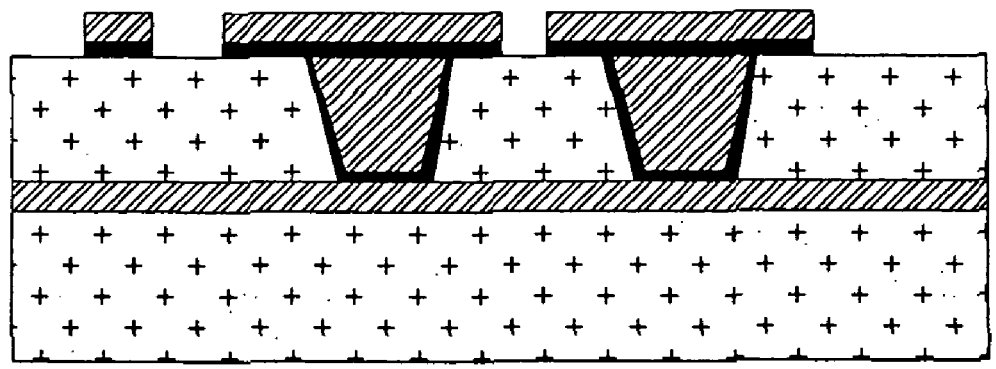

(10) Removing the exposed second seed layer and retaining the thickened wires, to form a desired conductive pattern, according to FIG. 6j. In this embodiment, the exposed second seed layer is removed by rapidly etching, as described in FIG. 6j.

(11) Repeating steps (1)-(10) to form an upper layer of wires, thereby providing inter-layer interconnections by the structures of stacked vias and providing fine wires.

We claim:

1. A method of manufacturing printed circuit boards and packaging substrates for integrated circuits, comprising:
   (1) forming a dielectric layer on a substrate, the dielectric layer having a surface;
   (2) creating blind vias in the dielectric layer so that the dielectric layer includes the blind vias and a remaining surface;
   (3) forming a seed layer on the dielectric layer to provide a first seed layer in each of the blind vias and a first seed layer on the remaining surface;
   (4) applying copper to the first seed layers to fill the blind vias to form solid conductive vias and to form a copper layer over the solid conductive vias and over the first seed layer on the remaining surface;
   (5) removing the copper layer and the first seed layer from the remaining surface to expose the remaining surface of the dielectric layer, and removing the copper layer from over the solid conductive vias to expose surfaces of the solid conductive vias;
   (6) forming a second seed layer on the remaining surface of the dielectric layer and on the exposed surfaces of the solid conductive vias;
   (7) applying a photo-sensitive thin film to the second seed layer, and creating a plating pattern in the photo-sensitive thin film using an image-transfer process, the plating pattern including regions of the photo-sensitive thin film that are plating resistant and regions in which the photo-sensitive thin film has been removed to expose a pattern of wires;
   (8) thickening the wires in the pattern of wires;
   (9) removing the regions of the photo-sensitive thin film that are plating resistant to expose portions of the second seed layer;
   (10) removing the exposed portions of the second seed layer and retaining the thickened wires, thus forming a first conductive pattern of wires;
   (11) repeating steps (1)-(10) to form a second conductive pattern of wires on the first conductive pattern of wires so as to provide inter-layer interconnections and fine wires.

2. The method according to claim 1, wherein the dielectric layer is formed on the substrate by coating resin, filming or laminating.

3. The method according to claim 1, wherein the blind vias are formed by laser perforation, plasma etching or photo exposure.

4. The method according to claim 1, wherein the first seed layers are formed by chemical deposition or sputtering.

5. The method according to claim 1, wherein the first seed layer on the remaining surface and the copper layer are removed by etching or abrading.

6. The method according to claim 1, wherein the thickening step includes thickening the wires in the pattern of wires by plating.

7. The method according to claim 1, wherein the exposed portions of the second seed layer are removed by etching.

8. The method according to claim 1, wherein the second seed layer is formed by chemical deposition or sputtering.

9. The method according to claim 8, wherein the second seed layer is a conductive layer.

\* \* \* \* \*